United States Patent
Cao et al.

[11] Patent Number: 6,139,811
[45] Date of Patent: Oct. 31, 2000

[54] EFG CRYSTAL GROWTH APPARATUS

[75] Inventors: Jeffrey X. Cao, Wayland, Mass.; Robert M. Giancola, E. Hampstead, N.H.; Charles G. Caprini, Wakefield; David Garcia, Leominster, both of Mass.

[73] Assignee: ASE Americas, Inc., Billerica, Mass.

[21] Appl. No.: 09/276,453

[22] Filed: Mar. 25, 1999

[51] Int. Cl.[7] .................................................. B01D 9/00
[52] U.S. Cl. .................... 422/245.1; 422/251; 117/16; 117/210
[58] Field of Search ............................. 422/245.1, 251; 117/16, 210

[56] References Cited

U.S. PATENT DOCUMENTS

| | | | |
|---|---|---|---|
| 3,591,348 | 7/1971 | LaBelle, Jr. ............................. | 117/23 |
| 4,028,059 | 6/1977 | LaBelle, Jr. et al. ................... | 117/210 |
| 4,230,674 | 10/1980 | Taylor et al. ........................... | 117/210 |
| 4,647,437 | 3/1987 | Stormont et al. ...................... | 117/210 |
| 4,968,380 | 11/1990 | Freedman et al. ....................... | 117/25 |
| 5,037,622 | 8/1991 | Harvey et al. .......................... | 117/210 |
| 5,085,728 | 2/1992 | Mackintosh et al. ............... | 422/245.1 |
| 5,098,229 | 3/1992 | Meier et al. ............................. | 406/93 |

FOREIGN PATENT DOCUMENTS 358151394A  9/1993  Japan .

*Primary Examiner*—Benjamin L. Utech
*Assistant Examiner*—Donald L. Champagne
*Attorney, Agent, or Firm*—Pandiscio & Pandiscio

[57] ABSTRACT

A new EFG (Edge-defined Film-fed Growth) crucible/die configuration is provided which (a) overcomes the tendency for silicon feed material to form a solid mass near the center hub region in the hot-zone during the crystal growth and (b) prevent the crucible/die unit from fracturing its supporting susceptor during cool-down.

10 Claims, 4 Drawing Sheets

EFG CRYSTAL GROWTH APPARATUS

This invention was made under Subcontract No. ZAF-6-14271-13, which is a subcontract under U.S. Prime Contract No. DE-AC36-83CH10093.

FIELD OF THE INVENTION

This invention relates to apparatus for growing crystalline bodies from a melt by the Edge-defined Film-fed Growth ("EFG") process, and more particularly to an improved die/susceptor assembly for use in growing hollow crystalline bodies by the EFG process.

BACKGROUND OF THE INVENTION

In the EFG process tubular crystalline bodies, e.g., hollow bodies with round or polygonal cross-sections, are grown on a seed from a liquid film of a selected feed material which is transported by capillary action from a melt contained in a crucible through one or more capillaries in a die to the top end surface of the die. EFG dies typically comprise a top end surface, inner and outer side surfaces which intersect the top end surface, and at least one capillary, i.e., a passageway of capillary proportions, having an upper end which terminates at the top end surface of the die and a lower end which communicates with the melt in the crucible. The shape of the crystalline body is determined by the external or edge configuration of the top end surface of the die. Polygonally-shaped hollow bodies of silicon, e.g., "nonagons" or "octagons", grown by EFG process are subdivided at their corners into a plurality of flat substrates that are used to form photovoltaic solar cells. Early designs of EFG dies for growing silicon octagons are exemplified by U.S. Pat. No. 4,230,674 issued to A. S. Taylor et al., and U.S. Pat. No. 4,647,437 issued to R. W. Stormont et al.

Use of the EFG process is complicated by the fact that variations in temperature tend to exist around the circumference of an EFG die when the die is used to grow crystalline bodies. Variations in thermal symmetry around the circumference of the die can cause local changes in thickness of the growing crystalline body. Such variations in thickness may be severe enough to render the crystalline body more susceptible to fracture, thereby reducing the number of solar cells which can be produced from the hollow polygonal crystalline body, inasmuch as the thinner substrates cut from the crystalline body tend to be prone to breakage. Significant variations in temperature around the circumference of the die also make it difficult to sustain growth, resulting in rupturing of the liquid menisci that extend between the die and the growing crystal body. When the menisci are ruptured, i.e., when the liquid/solid growth interface is terminated, liquid silicon tends to splash or overflow onto inner and/or outer surfaces of the die, resulting in formation of local deposits of silicon carbide (SiC) on the die surfaces that adversely affected the emissivity and thermal conductivity of the die, causing the temperature distribution around the die to became even less uniform. Eventually the deposits become severe enough to render the die unsuitable for further use. Premature loss of a die increases the costs of producing hollow bodies by the EFG process.

The wet tip die design disclosed by U.S. Pat. No. 5,037,622, issued to Harvey et al., improved upon prior die designs by reducing variations in thermal symmetry around the circumference of the die, thereby improving the quality of the grown bodies and reducing the rate of occurrence of rupturing of the menisci. However, even with dies embodying the design of Harvey et al there is a tendency for molten silicon to solidify near the center hub region in the hot zone during crystal growth. The solidified silicon grows outward of the center hub region and forms a "mushroom-shaped" solid piece that ultimately is large enough to block replenishment of the melt. Such solidification near the center hub region also affects the uniformity of the growing crystalline body and disrupts growth. Also fluctuations in temperature can result in a portion of the mushroom-shaped piece breaking off and falling into the melt, causing the crucible to overfill and flood the die. Moreover, cool-down of the apparatus at the end of a growth run often is accompanied by fracture of the susceptor on which the crucible is supported, necessitating its replacement. Replacing a fractured susceptor is costly, particularly with respect to lost production.

OBJECTS AND SUMMARY OF THE INVENTION

One object of the present invention is to provide an improved EFG die/crucible/susceptor assembly for growing hollow bodies that substantially prevents or minimizes undesired solidification of melt material near the center region of the die.

Another object of the present invention is to provide an improved EFG die/susceptor/crucible assembly that is designed to prevent damage to the susceptor underlying the die during cool-down of the crystal growth apparatus.

A further object is to reduce wetting between molten silicon and certain components associated with the center hub region of the of the EFG die/crucible assembly.

Another object of the invention is to reduce die temperature variations resulting from solidification of silicon onto members associated with the EFG die.

Still another object of the invention is to provide a new and improved method of growing a tubular crystalline body from a pool of melt.

The foregoing and other objects of this invention are achieved by modifying EFG die/susceptor assemblies of the type disclosed by Harvey et al. U.S. Pat. No. 5,037,622 so as reduce cold spots at the center region and thereby substantially prevent molten silicon from solidifying on surfaces of the die, or members associated with the die. Such silicon solidification is undesirable since it tends to impede the growth process and/or cause production of tubular bodies of poor quality.

The objective of this invention is to redesign the EFG die and the susceptor to eliminate the mushroom problems during the crystal growth, and to prevent the die from cracking the reusable susceptors during the cool-down.

BRIEF DESCRIPTION OF THE DRAWINGS

For a fuller understanding of the nature and objects of the present invention, reference should be made to the following detailed description taken in connection with the accompanying drawings wherein.

In the several figures, identical numbers refer to identical elements.

DETAILED DESCRIPTION OF THE INVENTION

Figure 1:
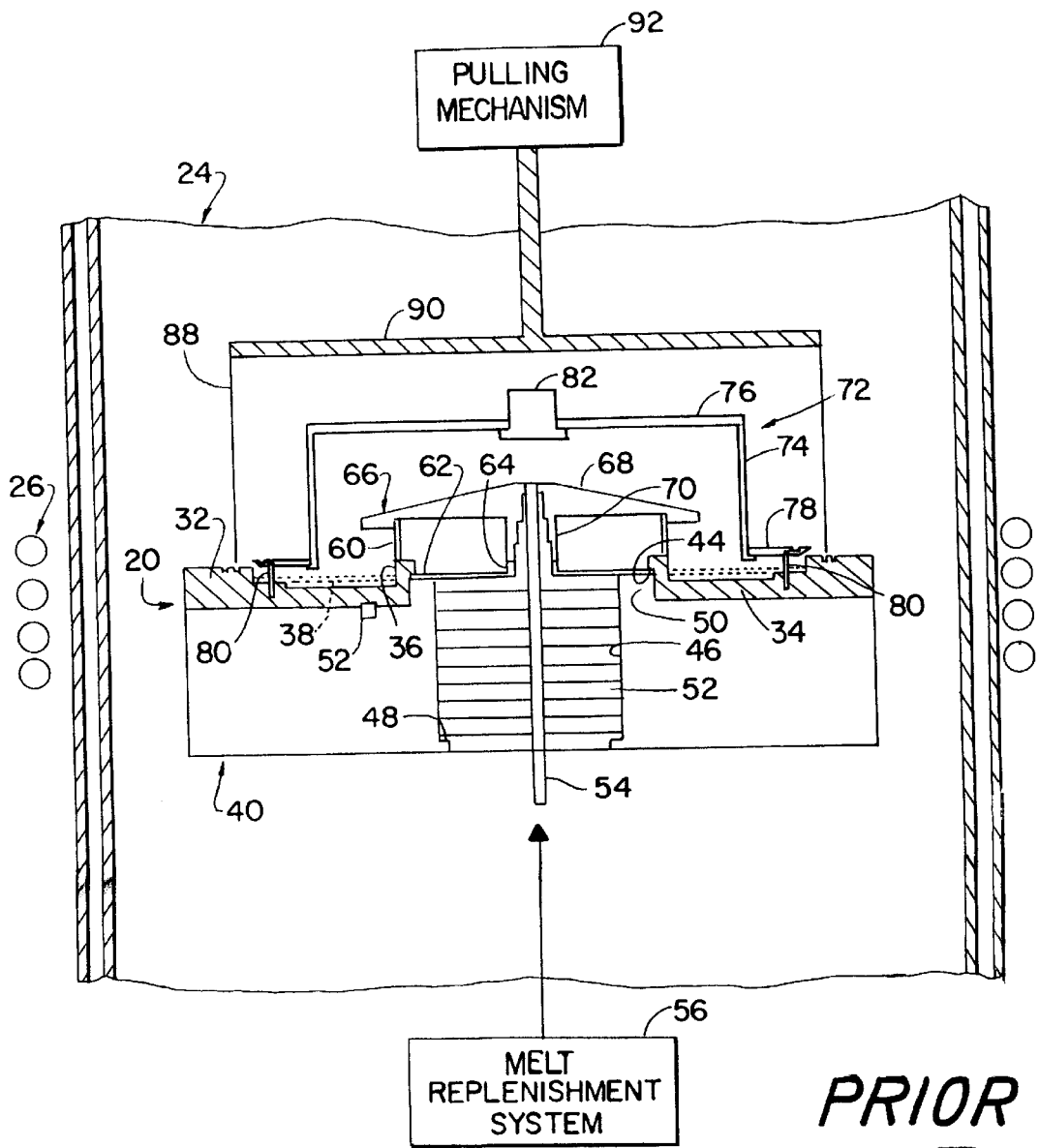
FIG. 1 is front elevation view, partly in cross section, of a conventional EFG crystal growth furnace apparatus showing a crucible/capillary die assembly of the type used prior to the present invention.
Figure 2:
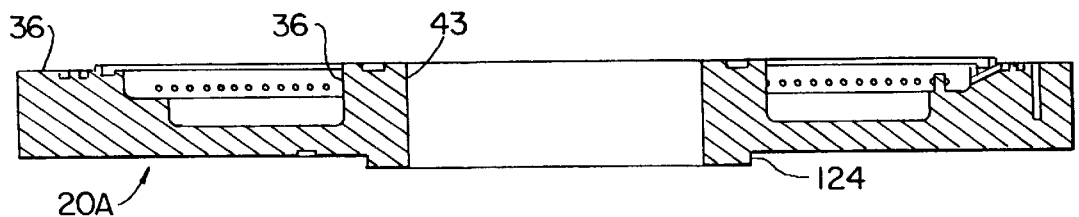
FIG. 2 is a cross-sectional view on a larger scale of a crucible/die assembly embodying the invention.

FIG. 1 illustrates conventional EFG crystal growth apparatus for growing tubular bodies. FIG. 1 shows a crucible/capillary die unit 20, made in accordance with the teachings of U.S. Pat. No. 5,037,622, installed in a furnace that comprises an enclosure 24 (only part of which is shown for simplicity of illustration), and a heating coil 26 surrounding enclosure 24. The crucible/die unit includes a short, open-topped crucible comprising an upstanding outer side wall 32, a bottom wall 34 and an annular inner side wall 36 which forms an annular hub. Outer side wall 32, bottom wall 34 and inner side wall 36 together define an annular space in which a melt 38 is contained. Although not visible in FIG. 1, the outer side wall 32 includes a capillary die portion that has substantially the same construction as the one illustrated in FIGS. 3–7 of said U.S. Pat. No. 5,037,622. The apparatus of FIG. 1 further includes a heat susceptor 40 which is positioned directly below and serves as a support for crucible/capillary die unit 20. Although not shown, it is to be understood that a pedestal mounted in furnace enclosure 24 acts as a support for susceptor 40 and crucible/die unit 20. U.S. Pat. No. 5,156,978 issued to B. R. Bathey illustrates use of a pedestal for supporting a susceptor and crucible in a furnace. Susceptor 40 is made of graphite or other suitable material and is heated by suscepting electromagnetic energy generated by heating coil 26. Susceptor 40 transmits its heat to the crucible/die unit 20 so as to maintain the silicon in the crucible in a molten state.

The central hub 36 of the die/crucible unit 20 defines a center hole 43 which is counterbored so as to form a shoulder 44. Susceptor 40 has a center hole 46 which is counterbored so as to form a shoulder 48. Susceptor 40 also has an annular projection or hub 50 on its upper side concentric with its center hole 46. Hub 50 extends into and makes a close fit with the center hole of hub 36, with shoulder 44 overlapping susceptor hub 50. One or more locator pins 52 disposed in holes in the under side of the crucible/die unit and the upper side of the susceptor serve to properly orient those members relative to one another. In this connection, it is to be noted that in growing a hollow body of polygon cross-sectional configuration, both the susceptor as well as the die are shaped to conform generally to that cross-sectional configuration.

The center hole 46 of the susceptor is filled with a multiple layers 52 of graphite felt insulation which surround a feed tube 54 that is connected to a melt replenishment system represented schematically at 56 that is adapted for delivering solid particles of silicon feed stock through into the region above the crucible, from which region the particles fall down into melt 38.

Various melt replenishment systems may be used with the apparatus shown in FIG. 1, provided that they are controlled so as to maintain the level of melt in crucible 24 within the limits suggested in said U.S. Pat. No. 5,037,622. Suitable melt replenishment systems are described in U.S. Pat. No. 4,968,380 issued to G. M. Freedman et al.; U.S. Pat. No. 5,085,728 issued to B. H. Mackintosh et al.; and U.S. Pat. No. 5,098,229 issued to F. U. Meier et al.

Mounted on the center hub of the crucible/die unit 20 is a standoff ring 60 made of graphite, and overlying hub 50 of the susceptor and the graphite felt insulation is an annular graphite plate or disk 62 that has an annular flange 64 at its inner edge. A silicon particle feed distributor or director member 66 having a conically-shaped upper surface 68 is supported near its outer edge by ring 60. Feed distributor member 66 also is made of graphite and has a center hole that accommodates the top end of delivery tube 54 and a depending tubular extension 70 that sits on flange 64 of plate 62. Distributor member 66 functions like an umbrella in that it intercepts falling silicon particles which then slide down its sloped upper surface 68 and spill into the crucible.

The apparatus of FIG. 1 also includes a hat-shaped member 72 that encloses distributor member 66. Member 72 comprises a side wall 74, a top wall 76, and a peripheral flange 78 at the bottom edge of the side wall. Member 72 is made of graphite and its flange 78 sits on a plurality of standoff pins 80 that that are mounted in blind holes in bottom wall 34 of the crucible/die unit. The center of member 72 is provided with a replaceable graphite insert 82 that acts as a deflector of silicon particles delivered via feed tube 54. Member 72 has a dual function. It acts as a plenum to contain and slowly release the gas used to transport silicon particles up feed tube 54. That gas passes between standoff pins 80 and also between flange 78 and the crucible/die unit 20 into the space inside of the growing hollow crystalline body 88. Member 72 also acts as an inner afterheater for the growing body 88. Although not shown, it is preferred that a second afterheater, like the one shown at 28 in said U.S. Pat. No. 5,037,622, surround the bottom end of the growing crystalline body 88 so as to provide better control of the temperature of that body in the region just above the growth interface.

The apparatus of FIG. 1 additionally comprises a seed holder schematically illustrated at 90 for holding a seed (not shown) onto which the crystalline body 88 is grown. The seed usually takes the form of a short section of a previously grown crystalline body so as to facilitate startup of the growth process. Seed holder 90 is attached to a pulling mechanism 92 which is adapted to move seed holder 90 axially toward and away from capillary die/crucible unit 20.

Growth of hollow bodies of silicon, e.g., octagons, using the apparatus of FIG. 1 is straightforward. The crucible/die unit 20 is heated by induction heating through the graphite susceptor 40. With growth initiated and maintained in the manner described in said U.S. Pat. No. 5,037,622, spherical silicon particles are continuously fed through the feed pipe 54 by a jet of inert gas. The particles discharged from pipe 54 are contained by graphite member 72 functioning as a plenum. The discharged silicon particles impinge upon deflector 82 which deflects them back onto the upper surface 68 of umbrella-shaped feed distributor member 66. Assuming that the upper end surface of the die portion of the crucible/die unit has an octagonal configuration, the crystalline body 88 grown and pulled from the graphite die is an "octagon", i.e., it is a tube having an octagonal cross-sectional configuration.

A problem occurs periodically when growing crystalline bodies with the conventional equipment shown in FIG. 1. The problem commences with the existence of some local cold spots at the center region of the crucible/die unit, which tend to cause some molten silicon to solidify in that center region. The vertical surface tension gradient resulting from the temperature variation acts to pull molten silicon from the melt 38 in the crucible up along the adjacent surface of inside wall 36 toward the standoff ring 60. The molten silicon is continuously transported to the center hub region by this surface tension gradient-driven convection. Molten silicon easily wets graphite; as a result some of the molten silicon is caused by the surface tension gradient to reach and wet ring 60. Silicon solidifies on the standoff ring which is cooler than the crucible/die unit. As more silicon particles are fed into the crucible via feed tube 54, the solidified silicon on ring 60 grows outward and forms a mushroom-like solid piece ("mushroom" for short). The mushroom even grows onto the peripheral portion of umbrella-shaped member 70. As the mushroom shaped solid continues to grow, it begins to block new silicon particles from reaching the melt and also causes severe non-uniformity in the circumferential temperature distribution at the growth interface.

In some cases the solid "mushroom" grows large enough to prevent any significant amount of silicon from falling into the crucible, resulting in premature termination of growth due to depletion of the supply of melt 38 in the crucible. In other cases, fluctuations in temperature can cause relatively large chunks of unmelted silicon to suddenly break from the mushroom and fall into the melt, which causes the crucible to overfill and flood, a condition that usually results in termination of growth. Even without such premature termination of growth, the non-uniform temperature distribution at the growth interface leads to an undesirably large variation in the wall thickness, which in turn reduces the total yield of acceptable silicon wafers cut from the grown hollow body.

The prior art arrangement of FIG. 1 also tends to suffer from a second problem that occurs during cool-down of the apparatus after a growth run is finished, particularly when the growth run is terminated prematurely. Molten silicon expands upon solidification. When the crucible/die unit cools down, silicon remaining in the crucible will expand and as it solidifies, it will cause the annular wall 36 at the center of the crucible/die unit to shrink, thereby reducing its inside diameter. Shrinkage of the inside diameter of wall 36 results in that wall exerting a radial compressive force on the hub portion 50 of susceptor 40, causing that hub portion 50 to fracture. This necessitates removal and replacement of the susceptor. If not for such fracture damage, the susceptor could be reused many times.

Referring now to FIGS. 2–6, the present invention provides a crucible/die unit 20A, a susceptor 40A and a standoff ring 60A which improve upon the corresponding components 20, 40 and 60 described above and are intended to replace the same in the growth apparatus of FIG. 1.

Figure 3:
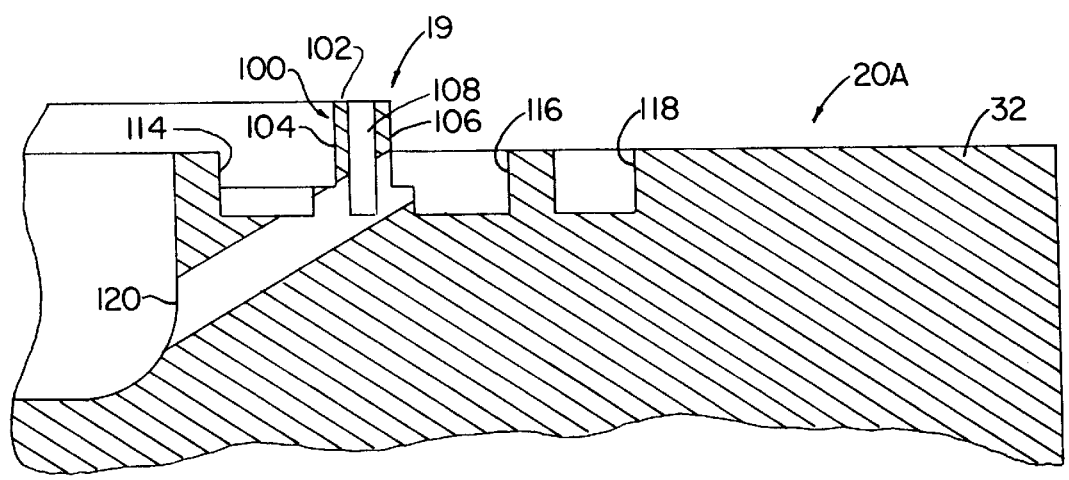
FIG. 3 is an enlarged fragmentary view of the crucible/die assembly of FIG. 2.
Figure 4:
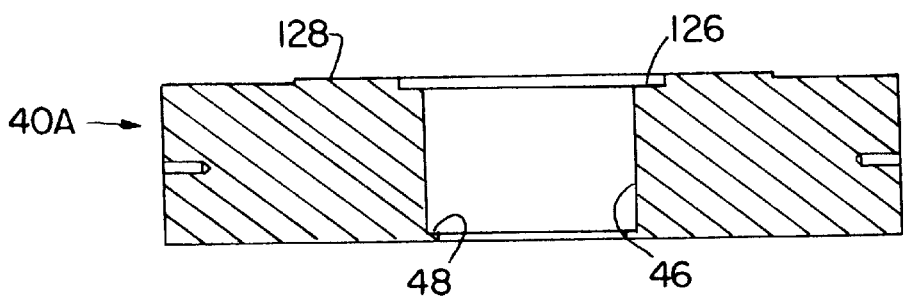
FIG. 4 is a sectional view in elevation of a susceptor made in accordance with the present invention that is used to support and impart heat to the crucible/die assembly of FIGS. 2 and 3.
Figure 5:
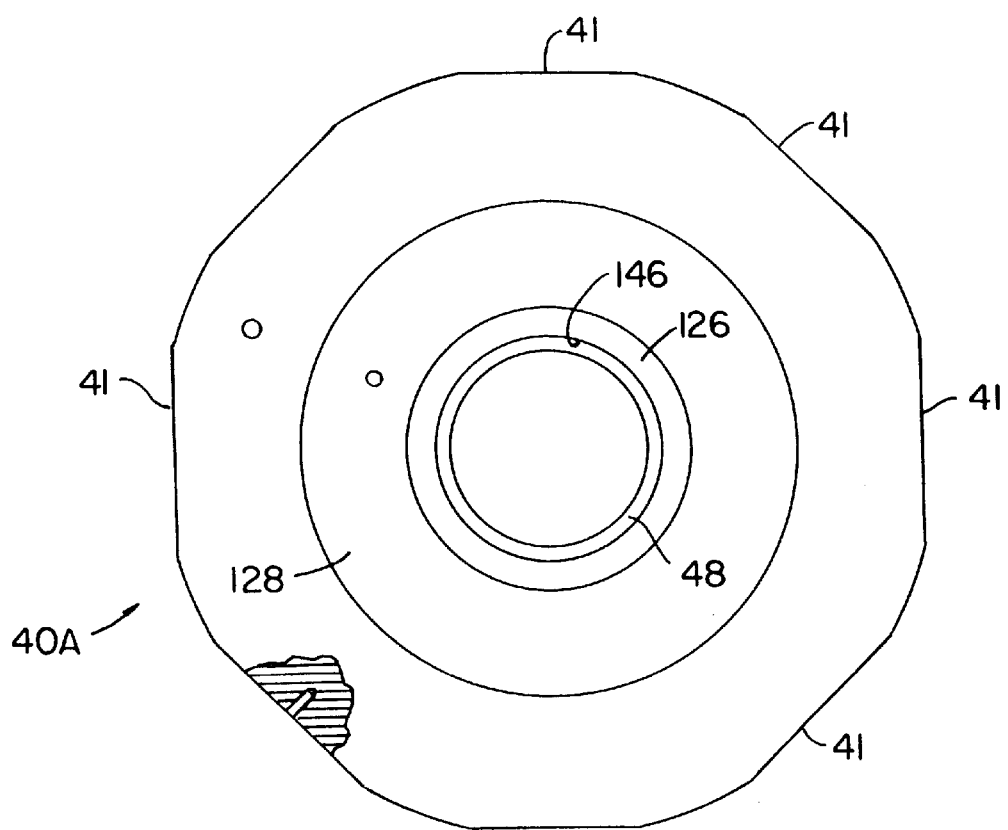
FIG. 5 is a plan view of the same susceptor.

Except as described hereinafter, the one-piece crucible/die unit 20A embodies the design disclosed by said U.S. Pat. No. 5,037,622 and is substantially the same as the crucible/die unit 20 shown in FIG. 1. The unit 20A comprises a capillary die 19 (FIG. 3) that is integral with and projects above the tope end surface of the outer side wall 32. Referring now to FIG. 3, the die 19 includes an upstanding die tip 100 having a top surface 102, inner and outer outside surfaces 104 and 106, and a central capillary slot 108. The crucible/die unit 20A further includes an inner moat 114, an outer moat 116, and an overflow moat 118 formed in the upper end surface of outer side wall 32. Preferably, the shape of inner moat 114, as seen in a plan view, corresponds to that of die tip 100. Thus, for instance, if the top surface of die tip 100 has an octagon configuration, then inner moat 114 also has an octagon configuration.

Die 19 also includes a plurality of circumferentially-spaced inclined passageways 120 formed in the outer side wall 32. Passageways 120 correspond to the passageways 180 of U.S. Pat. No. 5,037,622. Passageways 120 are positioned so that they intersect (1) moat 114, capillary slot 108, and (3) moat 116. As a result, inclined passageways 120 couple inner and outer moats 114 and 116 and capillary slot 108 with the interior of the crucible thereby permitting liquid silicon to be conducted by capillary action from the melt 38 in the crucible to the inner and outer moats and capillary slot 108. Except as hereinafter described, other details of the capillary die portion of crucible/die unit 20A are essentially the same as those of the preferred form of crucible/die design shown in U.S. Pat. No. 5,037,622, the disclosure of which is incorporated herein by reference.

Referring again to FIG. 2, crucible/die unit 20A differs from the corresponding unit 20 shown in FIG. 1 in that its center hole 43 lacks the flange 44 and instead the center hole 43 has a constant diameter. However, the bottom wall 34 is formed with a downwardly-extending annular projection or neck portion 124 whose inner and outer surfaces are cylindrical. As a consequence of eliminating the flange 44, the inner side wall 36 of crucible/die unit 20A can be made thicker than the corresponding wall 36 of the crucible/die unit 20. As noted below, the thicker inner side wall helps reduce variations in temperature.

The susceptor 40A is like susceptor 40 but differs therefrom in that its center hole 46 is not reduced in diameter at its bottom end by the presence of a shoulder like the shoulder 48 shown in FIG. 1. Instead its center hole 46 is counterbored at its top end so as to form an annular recess 126 that is sized to receive neck portion 124 in a close fit. Preferably, but not necessarily, the upper surface of susceptor 40A has a raised annular portion 128 surrounding its center hole. The presence of an annular portion as shown at 128 is not new. The periphery of susceptor 40A has a generally octagonal configuration so as to match a corresponding peripheral configuration (not shown) defined by the outer surface of the outer side wall 32 of crucible/die unit 20A. Susceptor 40A is oriented so that its eight flat outer surfaces 41 are aligned with corresponding outer surfaces of outer side wall 32.

Standoff ring 60A is like standoff ring 60, except that it is made of quartz instead of graphite. Molten silicon does not wet quartz as easily as it wets graphite, and the substitution of ring 60A for ring 60 is accomplished to substantially reduce the tendency to form a mushroom solid as described above.

Figure 6:
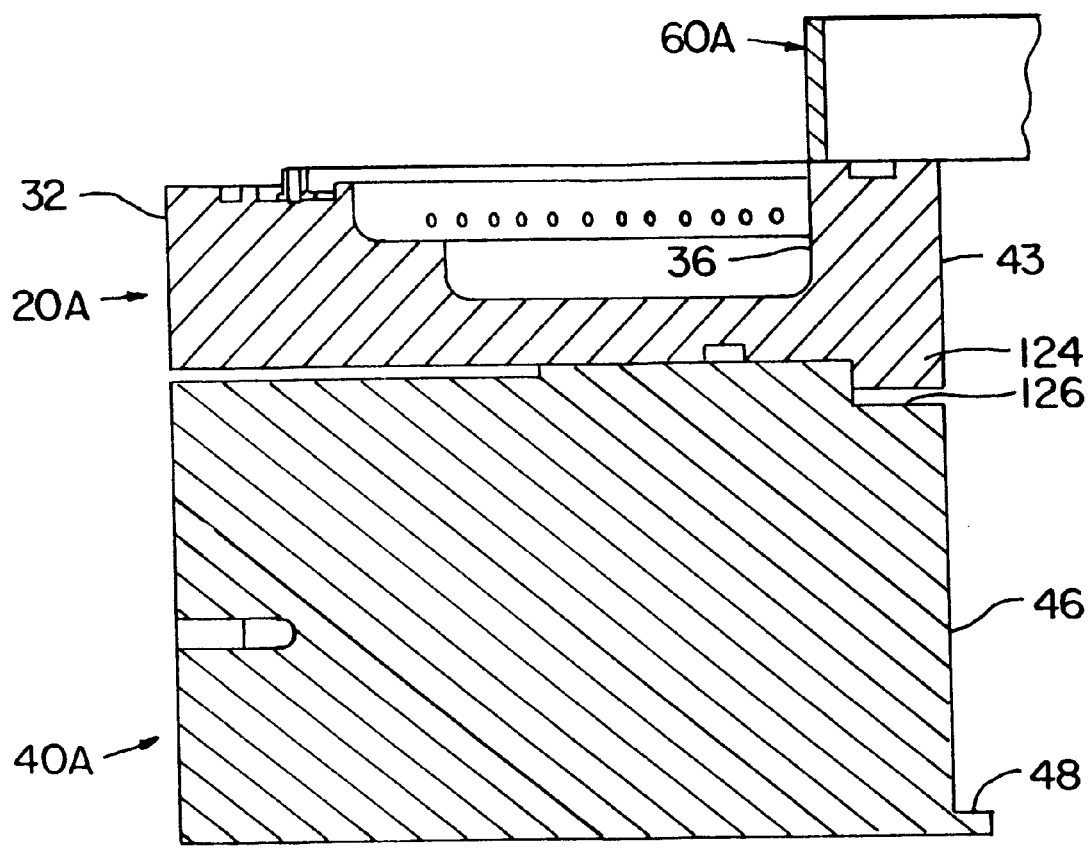
FIG. 6 is a fragmentary view illustrating the nesting relationship of the crucible/die unit and susceptor shown in FIGS. 2–5.

As seen in FIG. 6, the new design reverses the coupling between the die and the susceptor. Now since the crucible/die unit has its neck portion 124 extend into groove 126 of the susceptor, when the apparatus is cooled down the die is free to contract radially, thereby avoiding any danger of it fracturing the susceptor.

The apparatus improvements also eliminate the mushroom problems described above by (a) reducing the wetting between molten silicon and the center region as a consequence of replacing the graphite hub ring 60 with the quartz hub ring 60A; and (b) reducing cold spots by thickening the inner side wall 36 of crucible/die unit 20A, which improves the heating up of the center hub region. Eliminating the mushroom problems assures that the incoming silicon particles will spill into and form part of the melt 38, instead of piling up and forming a solidified mass on and around the distributor member 66.

A further advantage is that installing the improved crucible/die unit 20A, susceptor 40A and standoff ring 60A in crystal growth apparatus as shown in FIG. 1 does not require any further changes to that apparatus or to the method of growing hollow bodies. In this connection it should be noted that the present invention retains all of the advantages of the invention disclosed and claimed in said U.S. Pat. No. 5,037,622.

Certain changes and modifications may be made in the above device without departing from the scope of the invention herein involved. Thus, for example, the top end surface of the capillary die may have circular, elliptical, triangular, rectangular, or other configurations, depending upon what shape body is to be grown. Also, the relative dimensions of different portions of the die/crucible unit 20A, the susceptor 40A and the standoff ring 60A may be varied. Other changes in the design of the crucible/die assembly also may be made without departing from the principles of the present invention. Thus, for example, the crucible and EFG die may be formed as two separate and distinct members that are assembled to one another so as to form the functional equivalent of the integral crucible/die unit 20A shown in the drawings.

Still other possible modifications will be obvious to persons skilled in the art. Therefore, it is intended that all matter contained in the above description or shown in the accompanying drawings shall be interpreted in an illustrative and not in a limiting sense.

As used herein, the term "tubular" means a hollow elongate body having a cross-sectional shape in the form of a ring that preferably has a polygonal configuration, e.g., an octagon or nonagon, but alternatively may have a circular or other configuration; also the term annular is intended to embrace rings that have a polygonal, circular or other shape.

What is claimed is:

1. Apparatus for growing a tubular crystalline body of a selected material by the EFG process, the apparatus comprising:
   a crucible having a bottom wall, an outer side wall, and an inner side wall defining an interior space for containing a liquid supply of said selected material, and a capillary die formed integral with said outer side wall;
   said die comprising (a) tip means on the upper end of said outer side wall for use in supporting a liquid/solid growth interface and for controlling the configuration of said crystalline body, said tip means comprising a top end surface and inner and outer exterior surfaces intersecting said top end surface, and (b) transport means in said outer side wall for transporting said selected material in liquid form by capillary action from said crucible to said tip means so that said top end surface is constantly wetted with said melt during the growth of said crystalline body;
   said inner side wall defining an opening and said bottom wall having a bottom surface and an annular neck portion projecting below the level of said bottom surface; and
   a susceptor supporting said crucible, said susceptor having an upper surface that is substantially co-extensive with said bottom surface of said bottom wall, said susceptor also having a center hole that is aligned with said opening, said center hole being counterbored at its upper end so as to define a shoulder having an outer diameter larger than the diameter of said hole, said neck portion of said bottom wall extending into said counterbore in confronting relation with said shoulder.

2. Apparatus according to claim 1 wherein said neck portion rests on said shoulder.

3. Apparatus according to claim 1 further including an annular groove in the upper surface of said inner side wall, a ring made of quartz mounted in said groove and extending upwardly away from said inner side wall, and a feed distributor member mounted on said ring in concentric relation with said inner side wall and said opening.

4. Apparatus according to claim 3 further including a feed pipe extending through said hole, said opening and said feed distributor member.

5. Apparatus for growing a tubular crystalline body of a selected material by the EFG process, the apparatus comprising:
   furnace enclosure;
   a heat susceptor positioned within said enclosure, said susceptor having a hole therethrough;
   a crucible/capillary die assembly supported by said heat susceptor within said enclosure, said assembly having a bottom wall, an outer side wall, and an inner side wall defining an opening that is aligned with said susceptor hole and a crucible surrounding said opening for containing a liquid supply of said selected material, a capillary die formed integral with said outer side wall, said die having a tip for supporting a liquid/solid growth interface and for controlling the cross-sectional configuration of the grown crystalline body, and transport means in said outer side wall for transporting said selected material in liquid form by capillary action from said crucible to said die tip;
   a feed tube extending upwardly through said susceptor hole and said opening for use in injecting a gas stream carrying solid particle of said selected materials into the space above said crucible/die assembly;
   a quartz standoff ring supported on said inner side wall in surrounding relation to said feed tube;
   a deflector member positioned above the upper end of said feed tube in position to intercept solid particles of said selected material and deflect them downwardly toward said crucible; and
   a distributor member supported by said standoff ring in surrounding relation to the upper end of said feed tube, said distributor member being shaped and positioned so as to intercept solid particles of said selected material that are deflected downwardly by said deflector member and direct them into the crucible, whereby to replenish a melt of said selected material in said crucible.

6. Apparatus according to claim 5 wherein said selected material is silicon.

7. Apparatus according to claim 5 wherein said bottom wall has a bottom surface, and further wherein said crucible/die assembly has an annular neck portion projecting below the level of said bottom surface of said bottom wall in surrounding relation to said opening, and said susceptor hole is counterbored at its upper end so as to define a shoulder having an outer diameter larger than the diameter of said hole, said neck portion of said bottom wall extending into said counterbore in confronting relation with said shoulder.

8. Apparatus according to claim 7 wherein said neck portion engages said shoulder.

9. An apparatus for growing a tubular crystalline body of a selected material by the EFG process comprising:
   a crucible for containing a melt of said selected material, said crucible being annular so as to define a center opening;
   growing means for growing a tubular crystalline body of said selected material from said melt, said growing means comprising (1) a seed holder for supporting a seed onto which said crystalline body is grown and (2) pulling means for pulling said tubular crystalline body and said seed holder away from said crucible;

forming means formed integral with said crucible comprising tip means for supporting a film of said selected material from which said hollow tubular body is grown and for determining the cross-sectional configuration of said crystalline body, said tip means comprising a top end surface and inner and outer exterior surfaces intersecting said top end surface, capillary means for transporting said selected material in molten state by capillary action from said crucible to said top end surface, and passage means for transporting said selected material in molten state from said crucible to said inner and outer exterior surfaces so that said inner and outer exterior surfaces are wetted with said selected material during growth of said crystalline body;

a heat susceptor supporting said crucible, said susceptor having a hole therethrough in alignment with said opening;

electrical means for heating said susceptor;

a feed tube for injecting solid particles of said selected material into the space above said crucible, said tube extending through said hole and said opening with the upper end of said tube terminating above said inner side wall;

a deflector positioned above said upper end of said tube in position to intercept said particles and deflect them downwardly toward said crucible;

a quartz standoff ring mounted on said inner side wall; and a distributor member surrounding said feed tube below said deflector in position to direct falling particles of said selected material into said crucible.

10. An apparatus according to claim 9 wherein said crucible has a depending annular neck portion surrounding said opening, and said susceptor has a recess surrounding said hole for receiving said neck portion.

* * * * *

UNITED STATES PATENT AND TRADEMARK OFFICE
CERTIFICATE OF CORRECTION

PATENT NO.    : 6,139,811
DATED         : October 31, 2000
INVENTOR(S)   : Jeffrey X. Cao et al.

It is certified that error appears in the above-identified patent and that said Letters Patent is hereby corrected as shown below:

Column 8,
Line 13, insert the word -- a -- before "furnace".

Signed and Sealed this

Fourteenth Day of October, 2003

JAMES E. ROGAN
*Director of the United States Patent and Trademark Office*